United States Patent
Chen et al.

(10) Patent No.: US 6,482,555 B2
(45) Date of Patent: Nov. 19, 2002

(54) METHOD OF PATTERNING SUB-0.25λ LINE FEATURES WITH HIGH TRANSMISSION, "ATTENUATED" PHASE SHIFT MASKS

(75) Inventors: J. Fung Chen, Cupertino; Roger Caldwell, Milpitas; Tom Laidig, Point Richmond; Kurt E. Wampler, Sunnyvale, all of CA (US)

(73) Assignee: ASML Masktools Netherlands B.V., Veldhoven (NL)

( * ) Notice: Subject to any disclaimer, the term of this patent is extended or adjusted under 35 U.S.C. 154(b) by 0 days.

(21) Appl. No.: 09/976,336

(22) Filed: Oct. 15, 2001

(65) Prior Publication Data

US 2002/0048708 A1 Apr. 25, 2002

Related U.S. Application Data

(63) Continuation of application No. 09/270,052, filed on Mar. 16, 1999, now Pat. No. 6,312,854.
(60) Provisional application No. 60/078,281, filed on Mar. 17, 1998.

(51) Int. Cl.⁷ .................................................. G03F 9/00
(52) U.S. Cl. ................................ 430/5; 430/30; 716/19
(58) Field of Search ....................... 430/30, 5; 382/144; 716/19

(56) References Cited

U.S. PATENT DOCUMENTS

| | | | |
|---|---|---|---|
| 5,229,255 A | 7/1993 | White | |
| 5,242,770 A | 9/1993 | Chen et al. | |
| 5,256,505 A | 10/1993 | Chen et al. | |
| 5,288,569 A | 2/1994 | Lin | |
| 5,324,600 A | 6/1994 | Jinbo et al. | |
| 5,362,584 A | 11/1994 | Brock et al. | |
| 5,424,154 A * | 6/1995 | Borodovsky | 430/5 |
| 5,436,095 A | 7/1995 | Mizuno et al. | |
| 5,447,810 A | 9/1995 | Chen et al. | |
| 5,538,815 A | 7/1996 | Oi et al. | |
| 5,663,893 A | 9/1997 | Wampler et al. | |
| 5,707,765 A | 1/1998 | Chen | |
| 5,723,233 A * | 3/1998 | Garza et al. | 430/5 |
| 5,821,014 A * | 10/1998 | Chen et al. | 430/5 |
| 5,827,623 A * | 10/1998 | Ishida et al. | 430/5 |
| 6,312,854 B1 * | 11/2001 | Chen et al. | 430/5 |

* cited by examiner

Primary Examiner—Mark F. Huff
Assistant Examiner—Saleha R. Mohamedulla
(74) Attorney, Agent, or Firm—McDermott, Will & Emery

(57) ABSTRACT

A method for making a mask for optically transferring a lithographic pattern corresponding to an integrated circuit from the mask onto a semiconductor substrate by use of an optical exposure tool. The method includes the steps of de-composing the existing mask patterns into arrays of "imaging elements." The imaging elements are π-phase shifted and are separated by non-phase shifting and sub-resolution elements referred to as anti-scattering bars (ASBs). In essence, the ASBs are utilized to de-compose the larger-than-minimum-width mask features to form "halftone-like" imaging patterns. The placement of the ASBs and the width thereof are such that none of the π-phase shifting elements are individually resolvable, but together they form patterns substantially similar to the intended mask features.

28 Claims, 8 Drawing Sheets

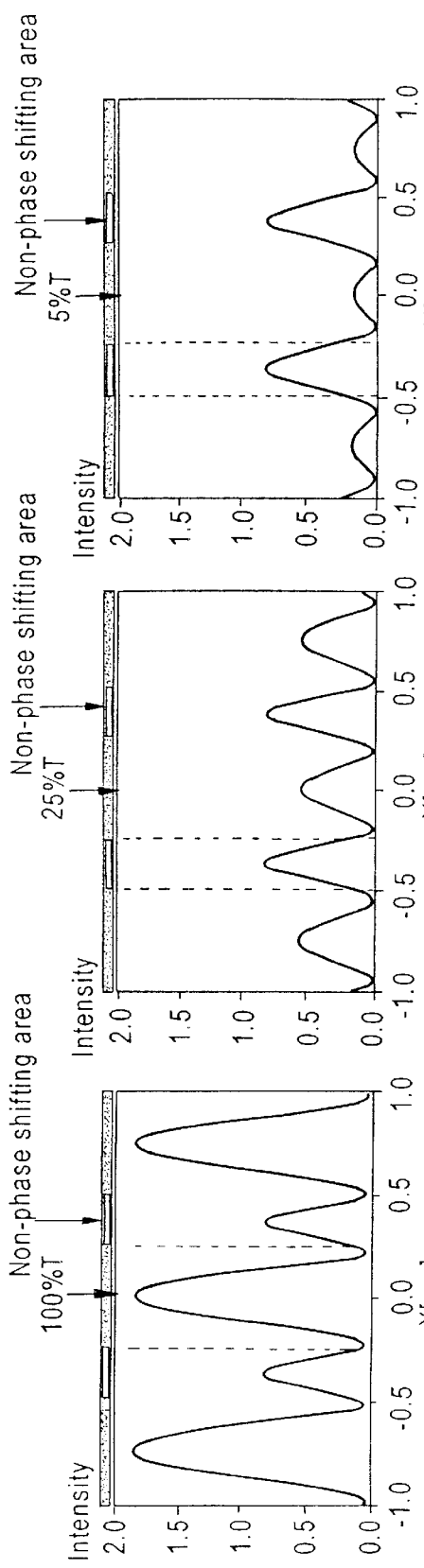
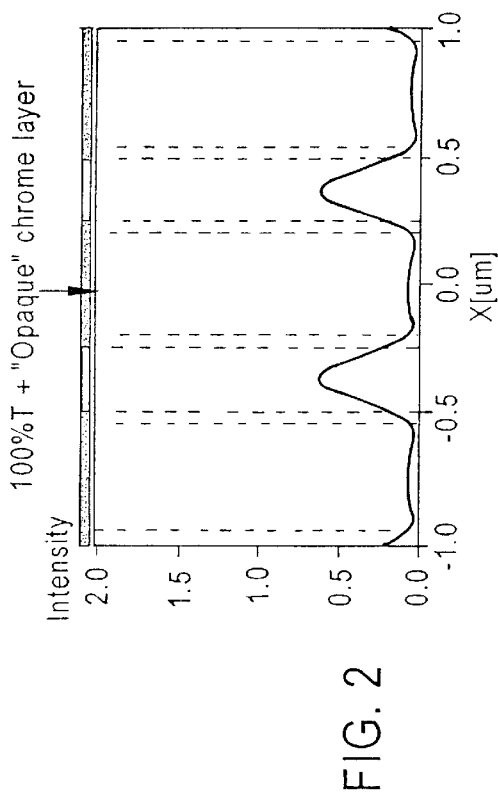

Layout for 1 μm width feature

Aerial image for 1μm 100% PSM feature

Layout for 1 μm width feature with ASB

Aerial image for 1 μm feature + ASB

Application of chrome-SB layout

FIG. 10A
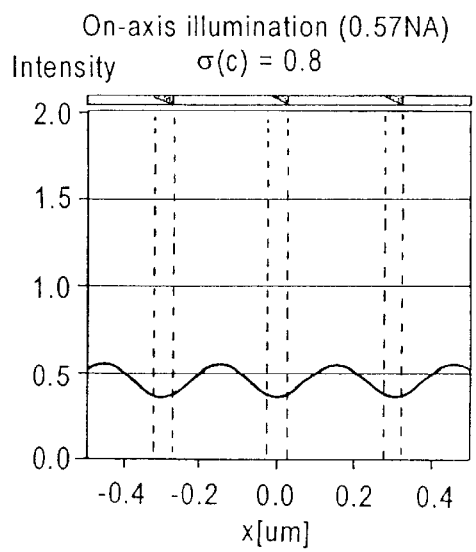
FIG. 10C
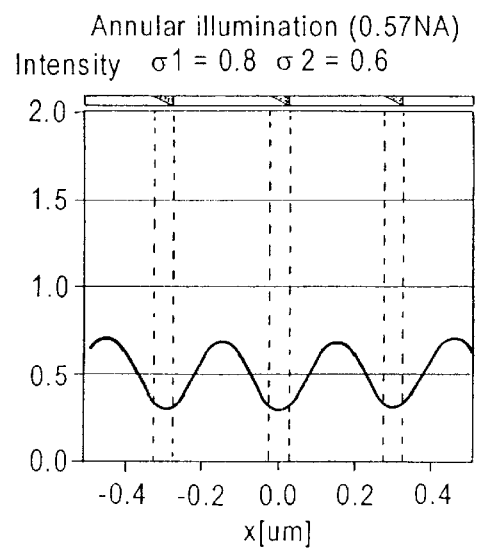
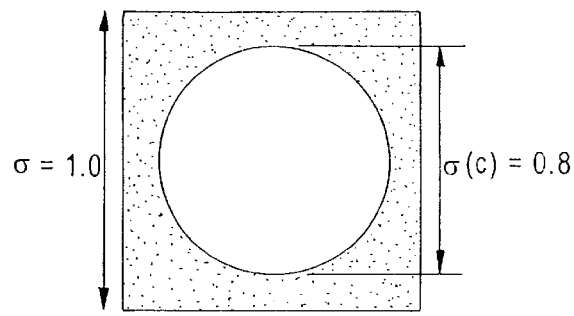
FIG. 10B
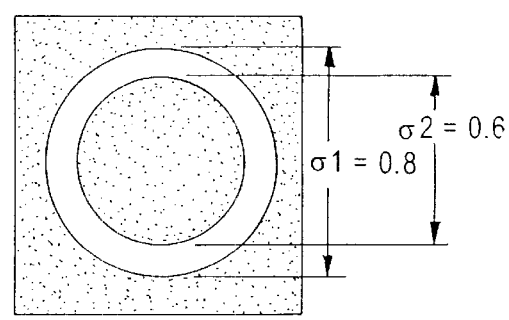
FIG. 10D

METHOD OF PATTERNING SUB-0.25λ LINE FEATURES WITH HIGH TRANSMISSION, "ATTENUATED" PHASE SHIFT MASKS

This application is a continuation of application Ser. No. 09/270,052 filed Mar. 16, 1999, now U.S. Pat. No. 6,312,854, which claims priority from Provisional Application Serial No. 60/078,281 filed Mar. 17, 1998.

FIELD OF THE INVENTION

The present invention relates to micro-lithography and, in particular, relates to resolution enhancement and proximity correction features utilized in the field of photolithography for semiconductor device fabrication.

BACKGROUND OF THE INVENTION

Until recently, improvements in the resolution of optical lithography processes have come largely from the use of Deep Ultra Violet (DUV) exposure sources having shorter exposure wavelengths (λ). Currently available DUV exposure sources include the following two types of excimer lasers: (1) Krypton Fluoride (KrF) having a λ of 248 nm and (2) Argon Fluoride (ArF) having a λ of 193 nm. However, in order to fabricate device generations at 0.18 μm (180 nm) and below, it has become clear to the industry that the lithography process will need to resolve feature dimensions below λ if either of the two foregoing exposure sources are to be utilized.

An alternative to utilizing the foregoing excimer lasers is non-optical lithography using very short exposure wavelength sources such as Extreme Ultra Violet (EUV), X-ray, or electron beam (E-beam). Unfortunately, all the non-optical lithography technologies require some form of technological break-through combined with an adequate support infrastructure in order to become "production-worthy," or in other words, commercially feasible. While it is likely that the necessary technology break-through and infrastructure build-up will eventually occur, to date they have not. As such, for semiconductor device production having design rules in the range of 0.18 μm down to 0.10 μm, optical lithography is currently considered to be the most economical and preferred process technology. Accordingly, there exists a need to find innovative methods that can consistently pattern sub-λ device features with optical lithography.

For sub-λ device features, the mask pattern image formation is strongly dependent on the optical diffraction with the immediately adjacent patterns. For binary-type masks such as chrome patterns on a quartz glass substrate, the resolution is diffraction limited as imposed by the exposure tool. However, by introducing a π phase shift as the exposure wavefront passes through the mask patterns, it has been demonstrated that the optical resolution limit can be greatly extended. Depending on the degree of phase shifting effect on the mask, it is possible to double the spatial frequency resolution for the mask patterns. In other words, the pattern resolution achievable with a phase shift mask (PSM) can reach ½λ.

The first PSM application in optical lithography was reported by M. D. Levenson in 1982 (IEEE Trans. Electron. Devices 29, 1828, 1982). Since this time, there has been a continuous effort in the industry to explore and develop PSM technology. However, due to the inherent complexity of mask design, the learning curve for making and applying PSM has been long and arduous. Nonetheless, several forms of practical PSM technology have been developed. With regard to making line and space patterns, there are three major types: 1) alternating PSM (as originally proposed by Levenson); 2) attenuated PSM; and 3) chromeless PSM.

In accordance with alternating PSM, 0-phase and π-phase alternating areas are formed between chrome mask features. There are two major unsettled issues concerning alternating PSM design. The first is the unavoidable conflict of phase assignment, and the second is the unwanted resist patterns caused by the 0 to π phase transitions on the mask. The currently proposed solutions to these issues either add more complexity to the mask design or require the use of more than one mask. As such, none of the proposed solutions are attractive from a "commercialization" or "production cost" point of view.

From a design viewpoint, alternating PSM is much more challenging than attenuated PSM. Attenuated PSM typically utilizes an energy absorbing thin film layer deposited on a quartz substrate. This energy absorbing film has the property of causing a 180 degree (π) phase change in the electric (E) field as the exposure wavefront passes through the mask. After mask patterns have been delineated, there is a π phase shift in between the attenuated film areas and non-patterning glass only areas. Unlike the traditional chrome mask, this type of PSM typically causes some amount of attenuation by the actinic (or effective) exposure λ. The extent of attenuation is mainly dependent on the phase shifting film structures and/or the interlayer thin chrome film deposited on the glass substrate. The attenuation permits a certain percent of actinic exposure λ to "leak" through the phase shifting areas of the mask. Normally the amount of attenuation is described as percent transmission (% T).

FIGS. 1A–1C illustrate aerial images of a typical attenuated PSM with intensity profiles (% T) equaling 100%, 25% and 5%, respectively. As can be observed from FIGS. 1A–1C, relatively high intensity levels result from the attenuated, phase shifted areas. The strength of the intensity levels seems to be related to the % T. Specifically, the higher the % T, the stronger the intensity level. For the non-phase shifting (glass only) areas, the intensity levels remains unchanged. In order to minimize these "undesirable" intensity levels resulting from the attenuation, the standard industry practice is to limit the % T to be at most 5% for DUV exposure λ.

Finally, with regard to chromeless PSM, the π phase shift area can be made by simply etching into the quartz substrate to a precise depth. The non-etched areas and the etched areas have an optical path difference (OPD) that can cause a π phase shift as the exposure wavefront passes through the mask. Optically, the chromeless PSM concept is substantially an extension of the attenuated PSM. In other words, the chromeless PSM can be thought of as an attenuated PSM with 100% transmission. As observed in FIG. 1A, for a high % T, the "leakage" of actinic exposure λ causes very strong aerial image intensity profiles.

Heretofore, the standard method for controlling the "undesirable" intensity levels is to limit the % T. Unfortunately, very low % T limits the potential resolution advantage that can otherwise be gained by using the phase shifting film. The lower the % T, the more the resulting film acts like a non-phase shifting chrome film. Accordingly, in order to achieve higher resolution, it is much more desirable to use a high % T attenuated PSM. One solution to the foregoing problem is to utilize an opaque film layer to "block" off the leaky phase shifting areas.

As shown in FIG. 2, a chrome opaque film can effectively minimize the "undesirable" intensities. The width of the chrome blocking layer needs to be smaller than the high %

T attenuated phase shifting areas. To manufacture this chrome blocking layer, it is necessary to perform a second resist coating, alignment, and imaging process. This second step requires tight control of the width of the chrome blocking layer and the alignment margin in order to ensure the chrome blocking layer will be effective and not interfere with the phase shifting pattern areas.

It is clear that one disadvantage of using a chrome blocking layer is the need to perform two alignment processes for making such a reticle. The chrome blocking layer is normally imaged by an optical laser pattern generator. As such, it often suffers from lower resolution and limited alignment accuracy. In addition, this second process step adds to both the complexity and cost of the mask.

Moreover, as stated, the chrome blocking layer is utilized to "block" the "undesirable" aerial image intensities formed by the high % T phase shifting areas. As shown in FIG. 2, the remaining aerial images are mainly formed by the non-phase shifting patterns. However, the aerial image intensity levels are not as high as the ones formed by the high % T phase shifting areas. As a result, the expected resolution enhancement from the traditional chrome-blocked PSM is substantially negated.

Accordingly, there remains a need for a mask which allows for the use of the high intensity levels formed by the high % T phase shifting areas (because the higher intensity levels offer an inherent higher resolution potential), and which does not require the use of chrome blocking layers so as to reduce the overall complexity and cost of the mask.

SUMMARY OF THE INVENTION

Accordingly, it is an object of the present invention to provide a cost effective and practical method for patterning sub-0.25 $\lambda$ resist line features using a type of 100% transmission, "attenuated" PSM.

More specifically, the present invention relates to a method for making a mask for optically transferring a lithographic pattern corresponding to an integrated circuit from the mask onto a semiconductor substrate by use of an optical exposure tool. The method comprises the steps of de-composing the existing mask patterns into arrays of "imaging elements." These imaging elements are π-phase shifted and are separated by a non-phase shifting and sub-resolution element referred to as anti-scattering bars (ASB). In essence, the ASBs are utilized to de-compose the larger-than-minimum-width mask features to form "halftone-like imaging patterns. The placement of the ASBs and the width thereof are such that none of the π-phase shifting elements are individually resolvable, but together they form patterns substantially similar to the intended mask features. The isolated minimum width line features can be formed by a single π-phase imaging element.

As described in detail below, the method of the present invention provides important advantages over the prior art. Most importantly, the present invention discloses a method for patterning sub-0.25 $\lambda$ resist line features using a type of 100% transmission, "attenuated" PSM. In accordance with the present invention, instead of trying to eliminate the image intensity caused by high transmission π-phase pattern areas, the method of the present invention makes use of the high contrast aerial image to achieve excellent printing resolution.

In addition, by extending the concept of ASBs, it is possible to "decompose" the π-phase feature patterns. Using the decomposed π-phase shifting elements, it is possible to reconstruct the random shaped device patterns, while simultaneously performing optical proximity correction by manipulating the size, shape, and placement of the decomposed π-phase shifting elements.

Furthermore, as the imaging concept for the high transmission, attenuated PSM method of the present invention is very similar to the conventional, non-phase shifting chrome mask patterning methods, it is believed that the adoption of this technology by the industry will be much easier as compared to alternating PSM technology. From the mask layout point of view, by utilizing the method of the present invention there is no need to be concerned with avoiding phase conflicts and printing of phase transitions onto the wafer. Thus, the mask layout complexity is greatly reduced. Moreover, as there is no need to use an opaque chrome blocking layer, the mask making process is much simpler.

The method of present invention also provides for the decomposition of a minimum line feature into an array of π-phase shifting elements so that it is possible to use a wider dimension element on the 4X mask to achieve printing 0.25 $\lambda$ feature on a wafer. As a result, the mask used for printing the sub-0.25 $\lambda$ features can be made at a reasonable cost.

Additional advantages of the present invention will become apparent to those skilled in the art from the following detailed description of exemplary embodiments of the present invention.

The invention itself, together with further objects and advantages, can be better understood by reference to the following detailed description and the accompanying drawings.

BRIEF DESCRIPTION OF THE DRAWINGS

FIGS. 1A–1C illustrate aerial images of a typical attenuated PSM with intensity profiles (% T) equaling 100%, 25% and 5%, respectively.

FIG. 2 illustrates an aerial image of a typical attenuated PSM utilizing an opaque chrome film layer.

FIG. 10 illustrates a comparison between aerial images for on-axis versus off-axis (annular) illumination.

DETAILED DESCRIPTION

The following detailed description relates to a novel method for patterning sub-0.25 λ resist features using a type of 100% transmission, "attenuated" PSM. As explained below, the novel method utilizes optical proximity correction (OPC) assist features to modulate the intensity levels in the phase shifting areas. As a result of the present invention, all the mask feature patterning can be done in one pass by a high resolution electron beam mask writer, thereby eliminating the need for use of chrome blocking layers.

In FIGS. 1A–1C, it was shown that for a certain width of non-phase shifting features, the strength of the aerial image intensity peaks was usable. However, as the width of non-phase shifting features becomes smaller (i.e., as the two phase shifting features move closer together), the intensity levels for non-phase shifting features become almost zero for 100% T, as shown in FIGS. 3A–3C.

Figures 3A, 3B, 3C:
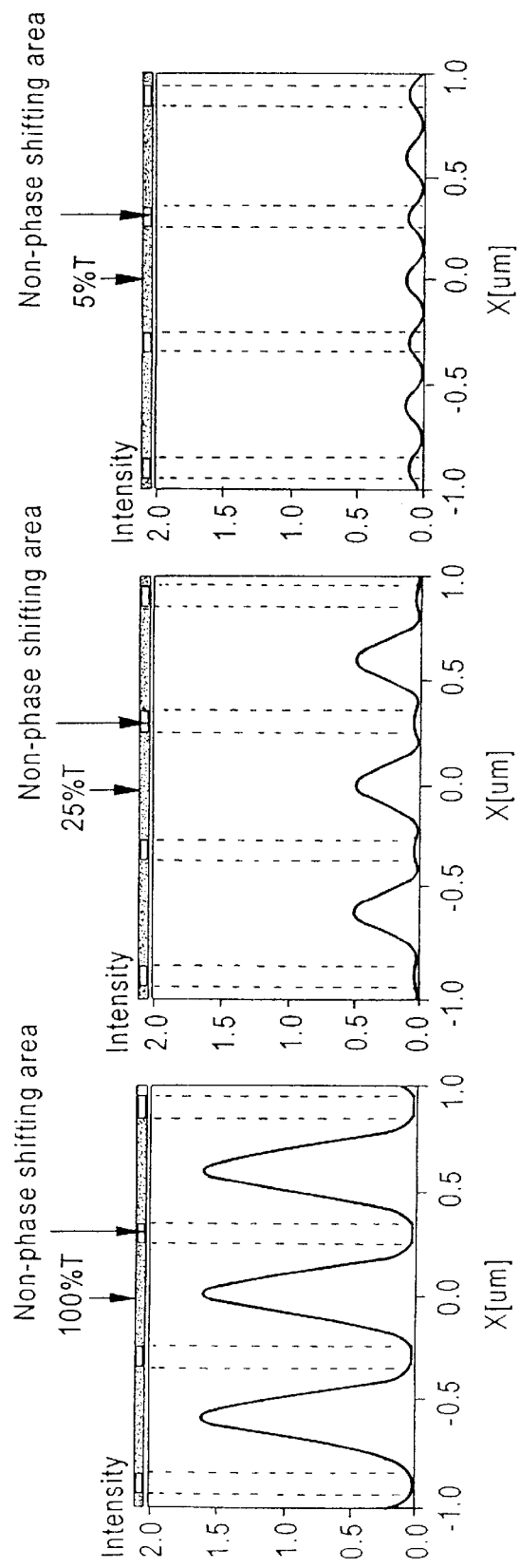
FIGS. 3A–3C are aerial images illustrating that as the width of non-phase shifting features becomes smaller, the intensity levels for non-phase shifting features tend toward zero.

As also shown in FIGS. 3A–3C, the intensity levels for the phase shifting features also decreased. At lower % T, the negative impact on the intensity levels of the phase shifting features becomes much more apparent and the intensity levels for the non-phase shifting features rise slightly. The net effect is an overall decrease of aerial image contrast for the phase shifting features. It is believed that the foregoing negative impact on the intensity levels is caused by optical proximity effects (OPE). In order to eliminate the foregoing negative effects resulting from the OPE, the present invention utilizes a novel sub-resolution clear OPC assist feature to control the intensity levels for the large phase shifting width features.

More specifically, when forming the mask in accordance with the present invention, each feature having a width greater than 1.22(λ/NAo) is "halftoned" utilizing anti-scattering bars (ASB). Anti-scattering bars, which are described in U.S. Pat. No. 5,447,810, are clear sub-resolution assist features. FIGS. 4A–4D illustrate a comparison between prior art feature patterning and the "halftoning" technique of the present invention.

Figure 4A:
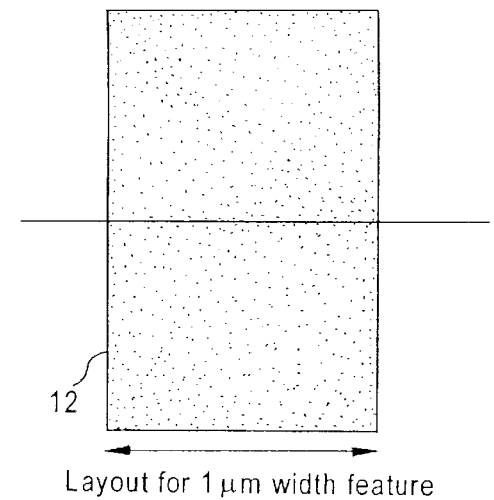
FIG. 4A illustrates a prior art layout for a 1 $\mu$m feature.
Figure 4B:
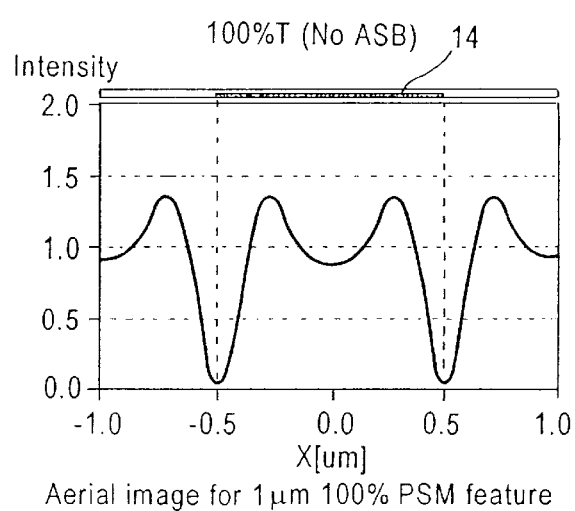
FIG. 4B illustrates the aerial image for the 1 $\mu$m feature of FIG. 4A utilizing 100% T attenuated PSM.

FIG. 4A illustrates an exemplary (prior art) layout for a 1 μm feature 12. FIG. 4B illustrates the aerial image for the 1 μm feature 12 utilizing 100% T attenuated PSM. As shown in FIG. 4B, the phase shifting area 14 associated with the feature 12 exhibits a substantial intensity level. As stated above, heretofore, such intensity levels were blocked by utilizing an additional chrome blocking layer.

Figure 4C:
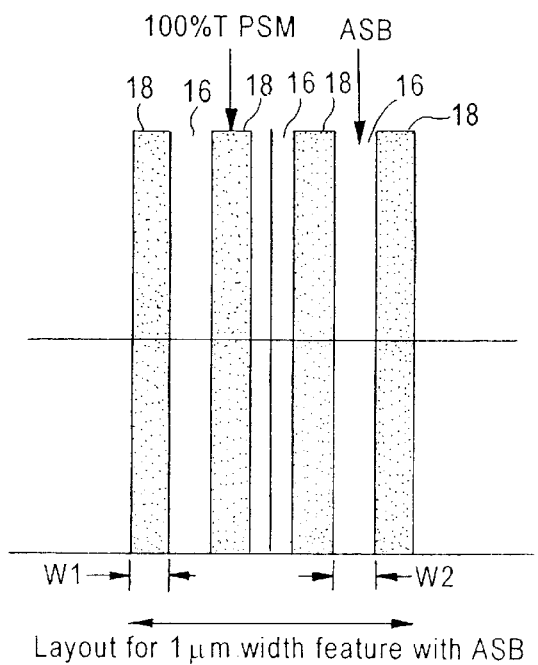
FIG. 4C illustrates an exemplary layout for a 1 $\mu$m feature "halftoned" utilizing ASBs in accordance with the present invention.
Figure 4D:
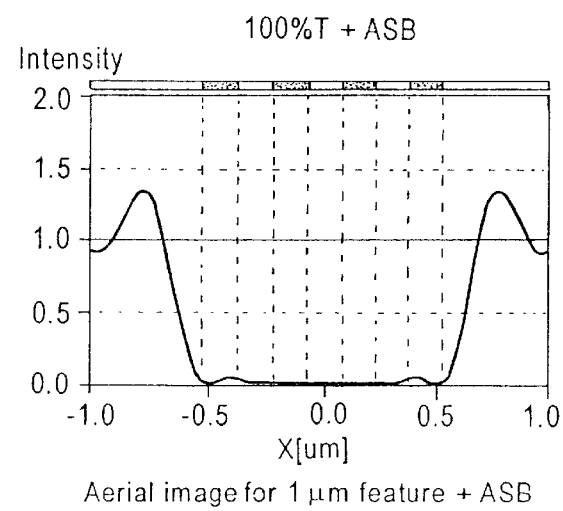
FIG. 4D illustrates the aerial image for the 1 $\mu$m feature of FIG. 4C utilizing 100% T attenuated PSM.

FIG. 4C illustrates the present invention which eliminates the effects of OPE without the need of a chrome blocking layer. As shown, in accordance with the present invention, the 1 μm feature is "halftoned" utilizing ASBs 16. In other words, the feature is formed such that π-phase shifting elements 18 are separated by ASBs 16 (i.e., the π-phase shifting elements are "halftoned"). Referring to FIG. 4D, the resulting aerial image for the "halftoned" feature illustrates the elimination of the unwanted intensity levels, even though 100% T attenuated PSM is utilized.

It has been determined that the preferred dimensions of the π-phase shifting elements 18 and the ASBs 16 are as follows:

a) the width (W1) of each π-phase feature is preferably between 0.20 to 0.35(λ/NAo), and b) the width (W2) of each ASB feature is preferably not greater than 0.35(λ/NAo), where NAo is the numerical aperture for the objective lens of the exposure source. In addition, the halftone period (HTP) of the "halftoned" feature, which is defined as the distance between the edge of one π-phase shifting elements 18 to the same edge of an adjacent π-phase shifting elements 18, must be kept sub-resolution such that the individual elements are non-resolvable by the optical exposure tool utilized in the photolithography process. It is noted that in FIG. 4C, the halftone period equals W1+W2. In order for the halftone period to be kept sub-resolution, in accordance with Rayleigh's criterion, the following equation must be satisfied:

$$HTP < k1\ (\lambda/NAo),$$

where k1=0.61, λ equals the wavelength of the optical exposure source, and NAo equals the numerical aperture of the objective lens of the exposure source.

The "halftoning" concept of the present invention, which essentially places ASBs, or "gaps" between π-phase shifting elements, can also be applied to features having random shapes. More specifically, utilizing the present invention it is possible to decompose random features into a series of π-phase shifting elements. In the case of a clear-field, chromeless (100% T attenuated) PSM, the main circuit features are formed by "π-phase" elements on the mask. It is noted that this technique is very similar to the traditional technique for forming chrome main features on glass. Because of this similarity, it is believed that it will be relatively easy for the industry to adopt this style of PSM as opposed to alternating PSM. Most importantly, there is no phase conflict problem, and therefore the PSM design complexity is greatly reduced. Moreover, as the 0 to π phase transition is used for pattern delineation, it is possible to obtain very high resolution.

Figure 5A:
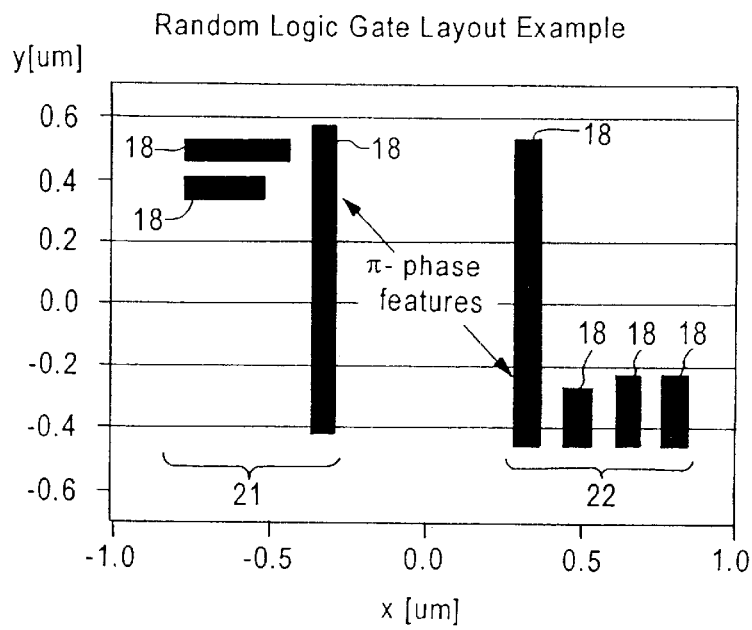
FIG. 5A illustrates the use of the present invention to form mask patterns for randomly shaped logic gate features to be utilized with 100% T attenuated (chromeless) PSM.
Figure 5B:
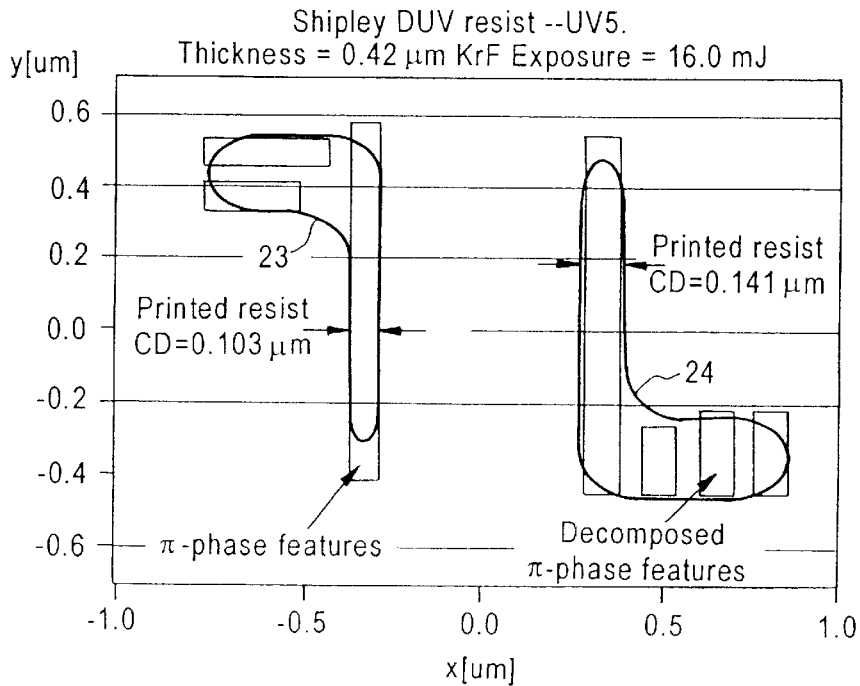
FIG. 5B illustrates the resulting printed resist patterns formed from utilizing the mask patterns of FIG. 5A.

FIG. 5A illustrates the use of the present invention to form mask patterns for randomly shaped logic gate features with 100% T attenuated (chromeless) PSM. As shown, both of the features 21, 22 are decomposed into a series of π-phase shifting elements 18 on the mask. FIG. 5B illustrates the resulting printed resist patterns 23, 24 (i.e., the solid dark line in FIG. 5B). Specifically, as shown in FIG. 5B, a 0.103 μm gate feature 23 is well printed, and the feature width is only 40% of the KrF exposure λ.

As indicated above, the 100% T attenuated PSM typically exhibits a strong OPE in the corners and line-ends of the feature. This OPE can be effectively compensated for by manipulating the shape, dimension, and placement of the π-phase shifting elements 18 forming the feature. Referring again to FIGS. 5A and 5B, there are two examples of forming randomly shaped gate device features. Applicants have discovered that in the strong electric field area, such as corners, a shorter/smaller π-phase shifting element 18 should be utilized. With a sophisticated OPC algorithm, a comprehensive OPC treatment can be made possible for sub-half wavelength patterning with this style of PSM technology.

Figure 6:
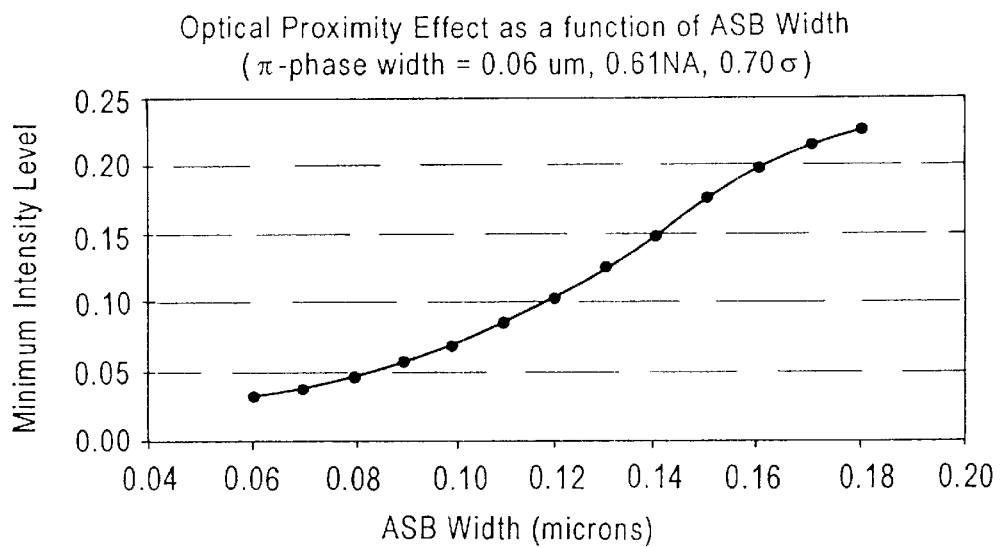
FIG. 6 illustrates an example of how OPE varies in accordance with ASB width.

More specifically, it was found that the OPE mentioned above can be expressed in terms of minimum intensity level of the π-phase shifting elements as a function of ASB width (i.e., the gap between the π-phase shifting elements). This is illustrated in FIG. 6. When printing a resist line feature with a positive photoresist process, such as the instance case, the minimum intensity level can be related to the resist feature width. Within the range of halftone period (0.24 μm), FIG. 6 illustrates an example of the minimum aerial image intensity of a 0.06 µm width π-phase shifting element being clearly dependent on the ASB width (which ranges from 0.06 µm up to 0.18 µm). In other words, the OPE can be modulated by the ASB width (or simply the separation between the edges of the π-phase shifting elements). As the OPE can be predetermined either by simulation or actual wafer printing experiment, it is possible to use a best-fit ASB width to correct for the OPE at desirable locations of the mask patterns.

A design guideline for decomposing the main features into π-phase shifting elements is as follows. The optimum π-phase shifting element dimension is preferably between 0.20 to 0.35(λ/NAo). It was determined that it is preferably for the ASB width to be the same as the π-phase shifting element and be less than 0.35(λ/NAo). However, as explained above, the ASB width is adjusted to correct for OPE. It is noted that in theory, the π-phase shifting element should be as small as possible such that a much finer OPC scheme could be implemented. However, given current mask production limitations, a minimum dimension of 0.20 (λ/NAo) is believed to be manufacturable on a 4X phase shift mask. For a 0.57 NA stepper with KrF exposure λ, the minimum 4X mask dimension is approximately 0.35 µm. This size feature is routinely formed utilizing currently known advanced OPC binary chrome masks.

One of the main limitations for printing near 0.25 λ features with 100% T attenuated (chromeless) PSM is mask process resolution. To achieve printing of 0.25 λ feature with a KrF exposure tool, the mask feature on a typical 4X DUV mask is going to be approximately 0.25 µm. While this may be attainable, it would be difficult and probably carry a yield penalty. For a production-worthy mask making process, it is easier if the mask feature can be made as large as possible while still small enough to correctly print 0.25 λ resist features on wafer.

However, by de-composing the minimum line feature into an array of π-phase shifting elements in accordance with the present invention, it is possible to use a wider dimension element on the 4X mask to achieve printing 0.25 λ feature on wafer. An example of such a mask layout is shown in FIG. 7.

Figure 7:
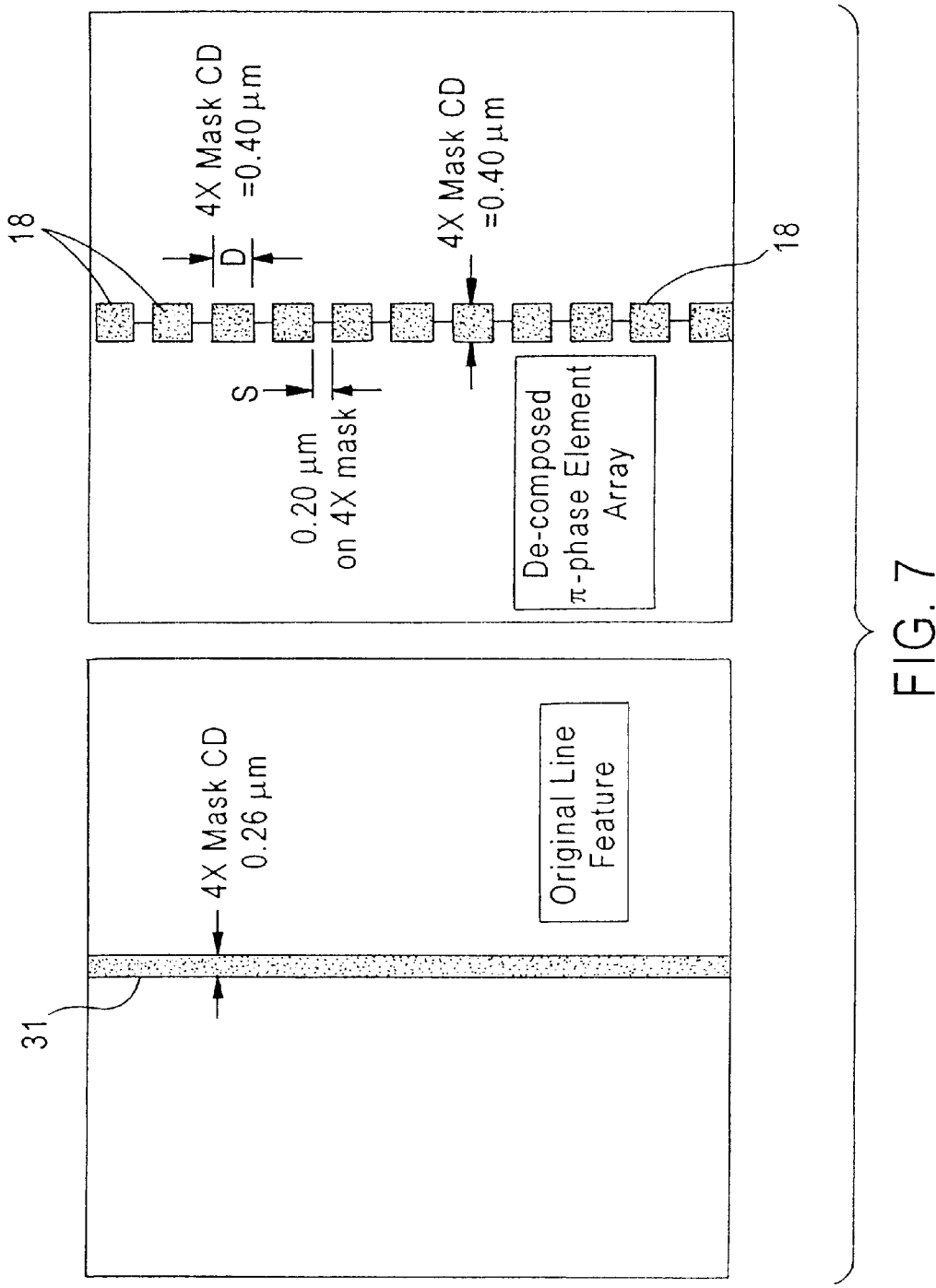
FIG. 7 illustrates an exemplary method of de-composing the minimum line feature into an array of π-phase shifting elements in accordance with the present invention.

As shown in FIG. 7, the original line feature 31 to be printed is a 0.26 µm line CD. In accordance with the present invention, the line feature is decomposed into an array of π-phase shifting elements 18 so as to form a "halftoned" line feature. Each π-phase shifting element 18 has a 0.4 µm mask CD, which is considerably larger than the original 0.26 µm line CD, and is therefore printed more easily. The π-phase shifting element array also satisfies the HTP requirement noted above. It has been determined that carefully-tuned, halftone line array elements can produce the same aerial image as one with a smaller line feature, as is illustrated in FIG. 8.

It has been determined that the aerial image profile of a halftone line π-phase array can be manipulated by adjusting the ASB width (or the separation between the edges of the two adjacent π-phase shifting elements) and the dimensions of the π-phase shifting elements. For the same aerial image profile, either larger π-phase shifting elements with wider ASB width or smaller π-phase shifting elements with narrower ASB width can be utilized. As the result of various experiments, it was discovered that it is permissible to increase the dimension of the π-phase shifting element by as much as 50%. This should be done within the range of the corresponding halftone period. As a result of this method, it is possible to make the halftone array have the same aerial image profile as one with a smaller non-halftone π-phase feature.

Figure 8:
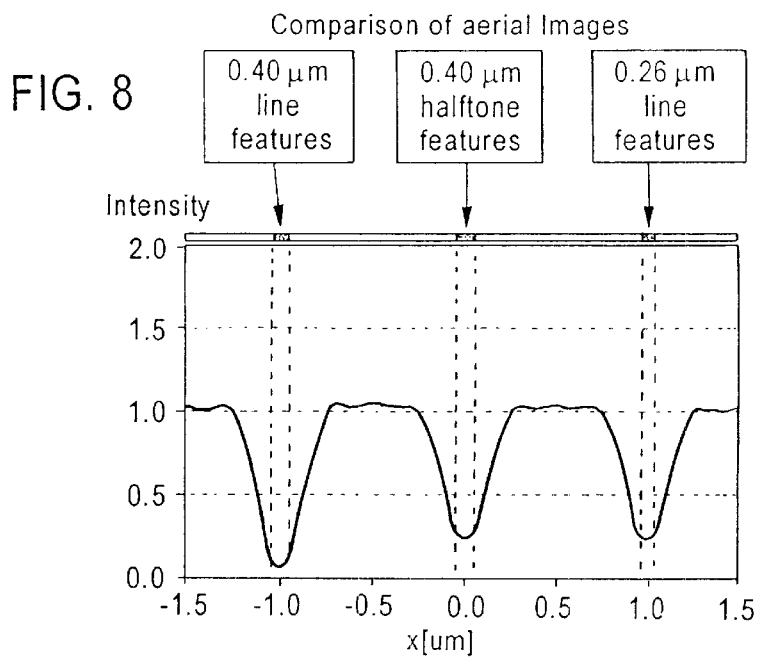
FIG. 8 illustrates a comparison of aerial images for the "halftoned" and "non-halftoned" line features set forth in FIG. 6, as well as the aerial image of a non-halftoned 0.40 $\mu$m line feature.

FIG. 8 illustrates a comparison of aerial images for the "halftoned" and "non-halftoned" line features set forth in FIG. 7, as well as the aerial image of a non-halftoned 0.40 µm line feature. As shown in FIG. 8, the 0.4 µm halftoned line feature prints with a nearly identical resist CD to that of a 0.26 µm non-halftone line feature, because the two features have almost the same aerial image profile.

The halftone duty cycle of the halftone line feature shown in FIG. 7 is approximately 67%. The halftone duty cycle (% H) equals (d/HTP)*100. HTP in the example shown in FIG. 7 is equal to D+S, where D is the length of a π-phase shifting element, and S is the spacing between π-phase shifting elements 18. By manipulating the halftone period to obtain a 50% duty cycle, it is possible to obtain an aerial image that is equivalent to an even smaller non-halftone mask line width. Thus, this novel method permits the use of readily manufacturable mask feature CDs (0.40 µm on 4X mask) to print resist features that are smaller than 0.25 λ.

Figure 9:
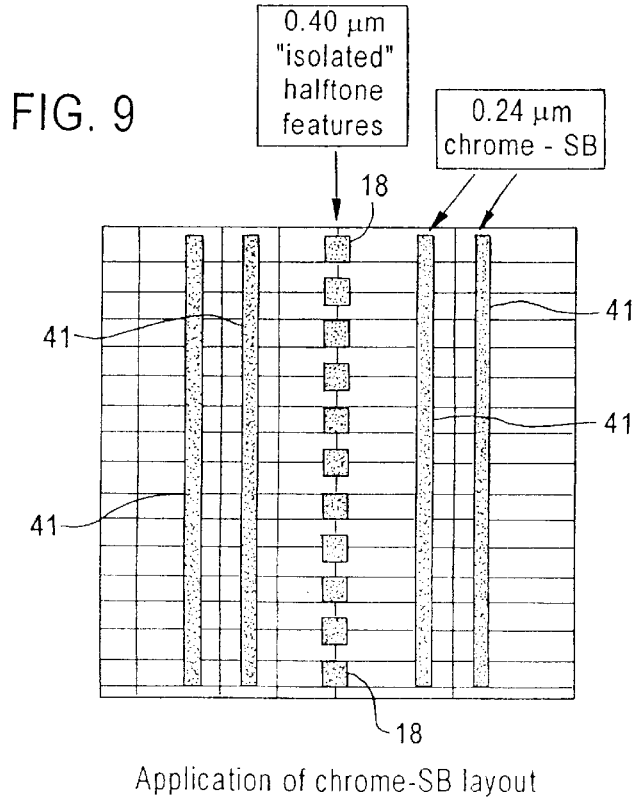
FIG. 9 illustrates an exemplary mask layout comprising dual chrome-SB for DOF improvement.

When printing such small features as shown for example in FIG. 7, another major concern is maintaining depth of focus performance. It has been discovered that the use of chrome scattering bars (SB) helps maintain resist CD throughout the focus window. FIG. 9 is an exemplary mask layout illustrating the application of dual chrome-SB to assist the halftone π-phase line feature.

As shown in FIG. 9, the SBs 41 utilized in the present example have a CD of 0.24 µm on the 4X mask. Since this is a non-phase shifting feature, the SBs 41 are well below the printable resolution. The main function of the dual SB 41 is to help maintain the log-slope of the aerial image for the "isolated" halftone π-phase shifting elements 18 while in a de-focus condition. Table 1 sets forth CD data obtained via a simulation utilizing a KrF exposure with 0.57 NAo, 0.75 σ, and a resist thickness of 0.42 µm (π represents the partial coherence ratio NAc/NAo, where NAc equals the numerical aperture of the illumination condenser.

TABLE 1

| 4X Mask CD OPC Focus (µm) | 0.40 µm Halftone with dual SB Resist CD (µm) | 0.40 µm Halftone No SB Resist CD (µm) | 0.26 µm Line No SB Resist CD (µm) |
|---|---|---|---|
| −0.5 | 0.039 | | |
| −0.4 | 0.057 | 0.045 | 0.049 |
| −0.3 | 0.067 | 0.064 | 0.067 |
| −0.2 | 0.070 | 0.071 | 0.072 |
| −0.1 | 0.069 | 0.068 | 0.070 |
| 0 | 0.062 | 0.053 | 0.059 |
| +0.1 | 0.046 | 0.020 | 0.030 |
| +0.2 | 0.020 | | |
| Exposure Used | 15.6 mJ/cm$^2$ | 14.4 mJ/cm$^2$ | 14.4 mJ/cm$^2$ |
| Estimated DOF | ≈0.45 µm | ≈0.30 µm | ≈0.30 µm |

From the data set forth in Table 1, it is clear that the use of SBs 41 does improve the DOF. However, even without the SB 41, the DOF performance is still very impressive at less than 0.25 λ, resist line width.

It is noted that while the use of chrome SBs 41 can improve DOF, the implementation of chrome SBs on a "chromeless" PSM requires an additional mask process step.

The re-alignment accuracy of the second mask making process can be an important factor to consider for deploying the SB. Empirically, the re-alignment accuracy needs to be +/− 50 nm (for 4X reticle) or better in order to ensure the effectiveness of the SB. Fortunately, such re-alignment accuracy is achievable by current mask making processes. The use of SBs appears most helpful when attempting to print at near or below λ/4 features, as indicated in Table 1. In this instance, the application of the SB is mainly to assist the more isolated π-phase features (single element or halftoned), or for π-phase feature-to-feature spaces that have sufficient room to insert a SB to attain the benefit.

It has been empirically determined that the placement of a single SB (i.e., one SB per each side of the halftone π-phase feature) is a function of λ and NAo, and the following equation has been derived:

SB edge separation to the halftone π-phase feature edge=$k_s$(λ/NAo), where $k_s$ ranges from 0.55 to 0.70.

$k_s$ is affected by the illuminator setting. For more incoherent illumination (σ>0.60) or off-axis illumination such as annular or quadrupole types, it is more effective to use 0.55 to 0.63 for $k_s$. Alternatively, for σ<0.60, it is more beneficial to use $k_s$ closer to 0.63 to 0.70. As an example, for a KrF exposure tool with 0.61 NA, with an illumination setting at 0.75 σ, the ideal SB placement would be ≅0.24 μm (or ≅0.96 μm on 4X reticle) away from the halftone π-phase shifting feature edge. Placing more than one SB per each side of the halftone π-phase shifting feature can further improve DOF. The second SB is preferably placed approximately 1.05 to 1.2 (λ/NAo) away from the edge of the of the halftone π-phase shifting feature. Using the same exposure tool example, the second SB is preferably placed at 0.18 μm (or 0.72 μm on 4X reticle) away from the nearest edge of the first SB. The placement of a third (and more) SB is less critical. For example, the third SB can be placed apart from the second SB utilizing the same amount of separation as between the first SB and the second SB.

It has also been empirically determined that the width of a single SB equals:

SB width=$k_w$(λ/NAo), where $k_w$ ranges from 0.20 to 0.25.

$k_w$ is mainly affected by the contrast of the resist process. For a higher contrast resist process, it is possible to use $k_w$ near 0.25 (or wider SB width). For the current state of the art KrF resist process, the typical SB width is 0.08 μm (or ≅0.32 μm on 4X reticle). For an ArF resist process, the SB is expected to be 0.06 μm (or ≅0.24 μm on 4X reticle).

Another limitation with regard to printing sub-0.25 λ resist line width, is the minimum feature pitch. It has been determined that the smallest feature-to-feature space that could be used for this technology is limited to approximately 0.70(λ/NAo). Below this feature-to-feature space range, the aerial image contrast becomes too low to form printable resist patterns. For example, for a 0.57 NA stepper and KrF exposure, the minimum feature-to-feature space printable is about 0.30 μm. For printing a 0.05 μm line feature, the minimum line/space ratio is nearly 1:6.

Utilizing a smaller λ and larger NAo clearly improves the aerial image contrast. However, for a given λ and NAo, the aerial image contrast can also be improved by utilizing off-axis illumination. FIG. 10 demonstrates this effect.

FIG. 10 illustrates a comparison between aerial images for on-axis versus off-axis (annular) illumination. The π-phase line feature is 0.05 μm and the space is 0.25 μm, both dimensions are in 1X wafer scale. It was found that with an optimized off-axis illumination, such as the one shown in FIG. 10, it is possible to shrink the printable feature-to-feature space to be slightly less than 0.60(λ/NAo). For this off-axis illumination case, it is believed that the printable feature space is at near KrF λ or 0.248 μm. This reduces the printable line to space ratio to 1:5.

Figure 11:
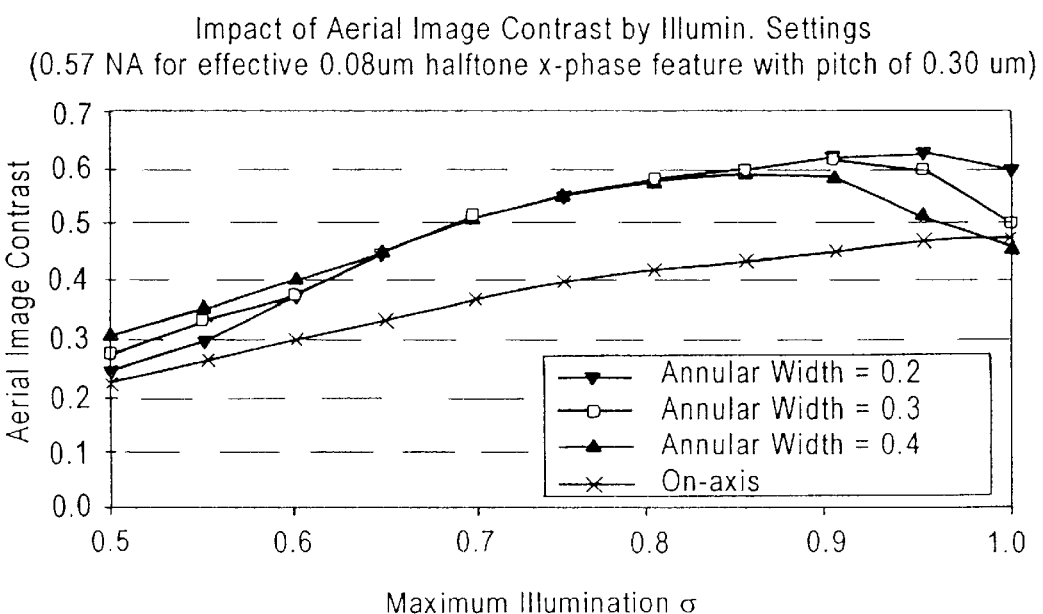
FIG. 11 illustrates the impact on aerial image contrast by maximum illumination setting.

The use of OAI is more beneficial for the circuit designs that require smaller feature pitch. The decision to use OAI is essentially determined by the need for minimum feature pitch. For example, if the current design calls for 0.06 μm circuit width with a minimum feature pitch of 0.30 μm, then the use of OAI for the printing process is helpful. The foregoing is illustrated in FIG. 11. Specifically, FIG. 11 plots the aerial image contrast of the 0.3 μm pitch feature against the maximum illumination a setting. The maximum illumination a refers to σ(c) or σ1, as indicated in FIG. 10.

As shown in FIG. 11, a higher illumination σ (i.e., a higher NAc) improves aerial image contrast. For the conventional on-axis illumination, the aerial image contrasts of such features never reach 0.5 when the ratio of NAc and NAo becomes unity (maximum σ of 1). An aerial image contrast of 0.5 or higher has been considered to be minimally resolvable. If OAI is utilized, such as the annular types shown in FIG. 11, the aerial image contrasts can be improved to above 0.5 for annular widths from 0.2 to 0.4. The annular width is defined as the delta between σ1 and σ2 in FIG. 10. In FIG. 11, it is also shown that the aerial image contrast is more influenced by the maximum illumination σ and less affected by the annular width. Since the wider annular width permits more "light" to go through, the necessary exposure time is reduced and more throughput is provided. Based on this, the optimum illumination setting is preferably set to maximum a in between 0.8 and 0.9 with annular width slightly less than 0.4.

FIG. 11 illustrates that OAI works well with halftone π-phase shifting features at effective λ/4 feature width. It is believed that OAI is more a function of feature pitch and less concerned with feature width. While not shown in FIG. 11, it is noted that the quadrupole type of OAI will also work well. This is due to the fact that both are off-axis illumination with obstructions in the center of the illumination. The same method, as described above, can be utilized to optimize the quadrupole illumination.

It is noted that the present invention is intended to be applicable to high transmission "attenuated" phase shift masks. The term "high transmission" encompasses a % transmission ranging from 6% to 100%.

As described above, the method of the present invention provides important advantages over the prior art. Most importantly, the present invention discloses a method for patterning sub-0.25 λ resist line features using a type of 100% transmission, "attenuated" PSM. In accordance with the present invention, instead of trying to eliminate the image intensity caused by high transmission π-phase pattern areas, the method of the present invention makes use of the high contrast aerial image to achieve excellent printing resolution.

In addition, by extending the concept of ASB, it is possible to "decompose" the π-phase feature patterns. Using the decomposed π-phase shifting element, it is possible to reconstruct the random shaped device patterns, while simultaneously performing optical proximity correction by manipulating the size, shape, and placement of the decomposed π-phase shifting elements.

Furthermore, as the imaging concept for the style of the high transmission, attenuated PSM method of the present invention is very similar to the conventional, non-phase shifting chrome mask patterning methods, it is believed that the adoption of this technology by the industry will be much easier as compared to alternating PSM technology. From the mask layout point of view, utilizing the method of the present invention there is no need to be concerned with avoiding phase conflicts and printing of phase transitions onto the wafer. Thus, the mask layout complexity is greatly reduced. Moreover, as there is no need to use an opaque chrome blocking layer, the mask making process is much simpler.

The method of present invention also provides for the decomposition of a minimum line feature into an array of π-phase shifting elements so that it is possible to use a wider dimension element on the 4X mask to achieve printing 0.25 λ feature on a wafer. As a result, the mask used for printing the sub-0.25 λ features can be made at a reasonable cost.

Although certain specific embodiments of the present invention have been disclosed, it is noted that the present invention may be embodied in other specific forms without departing from the spirit or essential characteristics thereof. The present embodiments are therefore to be considered in all respects as illustrative and not restrictive, the scope of the invention being indicated by the appended claims rather than the foregoing description, and all changes which come within the meaning and range of equivalency of the claims are therefore intended to be embraced therein.

What is claimed is:

1. A computer program product for controlling a computer comprising a recording medium readable by the computer, means recorded on the recording medium for directing the computer to generate a mask for use in a lithography process, said generation of said mask comprising the steps of:
   creating said mask having a lithographic pattern corresponding to an integrated circuit, said mask having a plurality of features to be printed; and
   de-composing at least one of said plurality of features having a width exceeding a predetermined value into a plurality of π-phase shifting elements, each of said plurality of π-phase shifting elements being separated from one another by a non-phase shifting element,
   wherein the distance between each of said plurality of π-phase shifting elements is such that none of the individual π-phase shifting elements are resolvable.

2. The computer program product of claim 1, wherein the space between each of said plurality of π-phase shifting elements comprises a non-phase shifting material.

3. The computer program product of claim 1, wherein each of said plurality of π-phase shifting elements has a width between $0.20*(\lambda/NAo)$ and $0.35*(\lambda/NAo)$, where λ equals the wavelength of the light source emitted by an optical exposure tool, and NAo equals the numerical aperture of an objective lens of said optical exposure tool.

4. The computer program product of claim 1, wherein each of said non-phase shifting elements has a width not greater than $0.35*(\lambda/NAo)$, where λ equals the wavelength of the light source emitted by an optical exposure tool, and NAo equals the numerical aperture of an objective lens of said optical exposure tool.

5. The computer program product of claim 1, wherein said predetermined value is $1.22(\lambda/NAo)$, where λ equals the wavelength of the light source emitted by an optical exposure tool, and NAo equals the numerical aperture of an objective lens of said optical exposure tool.

6. The computer program product of claim 3, wherein each of said plurality of π-phase shifting elements are equally spaced from one another, and each of said plurality of π-phase shifting elements have the same width.

7. The computer program product of claim 6, wherein said distance between each of said plurality of π-phase shifting elements and the width of each of said plurality of π-phase shifting elements define a halftone period, said halftone period being less than $0.61*(\lambda/NAo)$, where λ equals the wavelength of the light source emitted by an optical exposure tool, and NAo equals the numerical aperture of an objective lens of said optical exposure tool.

8. The computer program product of claim 1, wherein each of said non-phase shifting elements is transparent.

9. The computer program product of claim 1, wherein the generation of said mask further comprises placing scattering bars adjacent to any isolated π-phase shifting elements, each of said scattering bars having a width sufficiently narrow such that none of the individual scattering bars are resolvable.

10. The computer program product of claim 1, wherein said π-phase shifting elements are characterized by a percentage of transmission ranging from 6% to 100%.

11. A method for optically transferring a lithographic pattern corresponding to an integrated circuit from mask onto a semiconductor substrate by use of an optical exposure tool, said method comprising the step of:
   creating said mask having said lithographic pattern corresponding to said integrated circuit, said mask having at least one feature to be printed, said feature having a defined width;
   de-composing said feature into a plurality of π-phase shifting elements, each of said plurality of π-phase shifting elements being separated from one another by a non-phase shifting element, the distance between each of said plurality of π-phase shifting elements is such that none of the individual π-phase shifting elements are resolvable, and
   illuminating said mask utilizing off-axis illumination.

12. The method of claim 11, wherein said π-phase shifting elements are characterized by a percentage of transmission ranging from 6% to 100%.

13. The method of claim 11, wherein said de-composing of said feature into a plurality of said π-phase shifting elements assists in the minimization of optical proximity effects associated with the printing of said feature.

14. The method of claim 13, further comprising the step of adjusting the distance between said π-phase shifting elements so as to compensate for said optical proximity effects associated with the printing of said feature.

15. The method of claim 11, wherein each of said plurality of π-phase shifting elements has a width between $0.20*(\lambda/NAo)$ and $0.35*(\lambda/NAo)$, and each of said non-phase shifting elements has a width not greater than $0.35*(\lambda/NAo)$, where λ equals the wavelength of the light source emitted by said optical exposure tool, and NAo equals the numerical aperture of an objective lens of said exposure tool.

16. The method of claim 12, wherein each of said plurality of π-phase shifting elements are equally spaced from one another, and each of said plurality of π-phase shifting elements have the same width.

17. The method of claim 13, wherein said distance between each of said plurality of π-phase shifting elements and the width of each of said plurality of π-phase shifting elements define a halftone period, said halftone period being less than $0.61*(\lambda/NAo)$, where λ equals the wavelength of the light source emitted by an optical exposure tool, and NAo equals the numerical aperture of an objective lens of said optical exposure tool.

18. The method of claim 11, wherein each of said non-phase shifting elements is transparent.

19. The method of claim 11, wherein the creating of said mask further comprises placing scattering bars adjacent to any isolated π-phase shifting elements, each of said scattering bars having a width sufficiently narrows such that one of the individual scattering bars are resolvable.

20. A method for optically transferring a lithographic pattern corresponding to an integrated circuit from a mask onto a substrate by use of an optical exposure tool, said method comprising the step of:
   creating said mask having said lithographic pattern corresponding to said integrated circuit, said mask having at least one feature to be printed, said feature having a defined width;

de-composing said feature into a plurality of π-phase shifting elements, each of said plurality of π-phase shifting elements being separated from one another by a non-phase shifting element, the distance between each of said plurality of π-phase shifting elements is such that none of the individual π-phase shifting elements are resolvable, and adjusting the distance between said π-phase shifting elements so as to compensate for optical proximity effects associated with the printing of said feature.

21. The method of claim 20, further comprising the step of illuminating said mask utilizing off-axis illumination so as to transfer said lithographic pattern onto said substrate.

22. The method of claim 20, wherein said π-phase shifting elements are characterized by a percentage of transmission ranging from 6% to 100%.

23. The method of claim 20, wherein each of said plurality of π-phase shifting elements has a width between $0.20*(\lambda/NAo)$, and $0.35*(\lambda/NAo)$, and each of said non-phase shifting elements has a width not greater than $0.35*(\lambda/NAo)$, where λ equals the wavelength of the light source emitted by said optical exposure tool, and NAo equals the numerical aperture of an objective lens of said optical exposure tool.

24. The method of claim 20, wherein the generation of said mask further comprises placing scattering bars adjacent to any isolated π-phase shifting elements, each of said scattering bars having a width sufficiently narrow such that none of the individual scattering bars are resolvable.

25. A computer program product for controlling a computer comprising a recording medium readable by the computer, means recorded on the recording medium for directing the computer to generate a mask for use in a lithography process, said generation of said mask comprising the steps of:

creating said mask having a lithographic pattern corresponding to an integrated circuit, said mask having at least one feature to be printed, said feature having a defined width;

de-composing said feature into a plurality of π-phase shifting elements, each of said plurality of π-phase shifting elements being separated from one another by a non-phase shifting element, the distance between each of said plurality of π-phase shifting elements is such that none of the individual π-phase shifting elements are resolvable, and adjusting the distance between said π-phase shifting elements so as to compensate for optical proximity effects associated with the printing of said feature.

26. The computer program product of claim 25, wherein said π-phase shifting elements are characterized by a percentage of transmission ranging from 6% to 100%.

27. The computer program product of claim 25, wherein each of said plurality of π-phase shifting elements has a width between $0.20*(\lambda/NAo)$ and $0.35*(\lambda/NAo)$, and each of said non-phase shifting elements has a width not greater than $0.35*(\lambda/NAo)$, where λ equals the wavelength of the light source emitted by an optical exposure tool, and NAo equals the numerical aperture of an objective lens of said optical exposure tool.

28. The computer program product of claim 25, wherein the generation of said mask further comprises placing scattering bars adjacent to any isolated π-phase shifting elements, each of said scattering bars having a width sufficiently narrow such that none of the individual scattering bars are resolvable.

* * * * *